(12) United States Patent
Joo (10) Patent No.: US 8,854,894 B2
(45) Date of Patent: Oct. 7, 2014

(54) SEMICONDUCTOR MEMORY DEVICE AND PROGRAM METHOD THEREOF

(71) Applicant: SK hynix Inc., Icheon-si (KR)

(72) Inventor: Byoung In Joo, Yongin-si (KR)

(73) Assignee: SK Hynix Inc., Icheon (KR)

( * ) Notice: Subject to any disclaimer, the term of this patent is extended or adjusted under 35 U.S.C. 154(b) by 20 days.

(21) Appl. No.: 13/830,780

(22) Filed: Mar. 14, 2013

(65) Prior Publication Data

US 2014/0160856 A1    Jun. 12, 2014

(30) Foreign Application Priority Data

Dec. 7, 2012 (KR) .......................... 10-2012-0141724

(51) Int. Cl.
*G11C 16/06* (2006.01)
*G11C 16/10* (2006.01)
*G11C 16/34* (2006.01)

(52) U.S. Cl.
CPC ............ *G11C 16/10* (2013.01); *G11C 16/3459* (2013.01)
USPC ...................................................... 365/185.22

(58) Field of Classification Search
USPC ............. 365/185.22, 185.18, 185.23, 185.17, 365/185.19
See application file for complete search history.

(56) References Cited

U.S. PATENT DOCUMENTS 7,352,629 B2 * 4/2008 Chen ......................... 365/185.22

FOREIGN PATENT DOCUMENTS

| KR | 10-2009-0036839 A | 4/2009 |
| KR | 10-2012-0017279 A | 2/2012 |

* cited by examiner

*Primary Examiner* — David Lam (57) ABSTRACT

A program method of a semiconductor memory device includes performing a verify operation on selected memory cells by applying a selected word line voltage to a selected word line, continuously increasing the selected word line voltage without discharging the selected word line after the verify operation, and performing a program operation on the selected memory cells when the selected word line voltage reaches a program voltage level.

20 Claims, 6 Drawing Sheets

SEMICONDUCTOR MEMORY DEVICE AND PROGRAM METHOD THEREOF

CROSS-REFERENCE TO RELATED APPLICATION

The present application claims priority to Korean patent application number 10-2012-0141724 filed on Dec. 7, 2012, in the Korean Intellectual Property Office, the entire disclosure of which is incorporated by reference herein.

BACKGROUND

Embodiments of the present invention relate to an electronic device and, more particularly, to a semiconductor memory device and a program method thereof.

A semiconductor memory device is a storage device that is realized using semiconductor such as silicon (Si), germanium (Ge), gallium arsenide (GaAs), or indium phosphide (InP). Semiconductor memory devices are classified into volatile memory devices and nonvolatile memory devices.

A volatile memory device is a memory device that loses its stored data when power supply is off. The volatile memory device may include a static random access memory (SRAM) device, a dynamic RAM (DRAM) device, a synchronous DRAM (SDRAM) device, or the like. A non-volatile memory device is a memory device that retains its stored data even when not powered. The non-volatile memory may include a read only memory (ROM) device, a programmable ROM (PROM) device, an electrically programmable ROM (EPROM) device, an electrically erasable and programmable ROM (EEPROM) device, a flash memory device, a phase-change RAM (PRAM) device, a magnetic RAM (MRAM) device, a resistive RAM (RRAM) device, a ferroelectric RAM (FRAM) device, or the like. The flash memory device is classified into a NOR type and a NAND type.

During program of a semiconductor memory device, a verify operation and a program operation may be repeated. When each of the verify operation and the program operation is performed, corresponding voltages are applied to word lines coupled to a memory cell array. In order to change voltage levels of the corresponding voltages to desired voltage levels in each of the verify operation and the program operation, precharge and discharge operations need to be performed during the program of the semiconductor memory device, and thus a predetermined amount of time is required to perform the precharge and discharge operations. As a result, as a time taken to perform the precharge and discharge operations increases, a program speed of the semiconductor memory device may increase.

BRIEF SUMMARY

Embodiments of the present invention are directed to improve a program speed of a semiconductor memory device.

A program method of a semiconductor memory device according to an embodiment of the present invention includes performing a verify operation on selected memory cells by applying a selected word line voltage to a selected word line coupled to the selected memory cells; continuously increasing a voltage level of the selected word line voltage without discharging the selected word line after the verify operation is performed; and performing a program operation on the selected memory cells when the selected word line voltage reaches a program voltage level.

A program inhibit voltage may be applied to bit lines coupled to the selected memory cells while the selected word line voltage increases. The program inhibit voltage may be a power voltage.

The performing of the verify operation may further include applying an unselected word line voltage to unselected word lines, and the program method may further include continuously increasing a voltage level of the unselected word line voltage without discharging the unselected word lines after the verify operation is performed. The program operation may be performed when the unselected word line voltage reaches a program pass voltage level.

A program method of a semiconductor memory device according to another embodiment of the present invention includes performing a verify operation on selected memory cells by applying a selected word line voltage to a selected word line and applying an unselected word line voltage having a higher voltage level than the selected word line voltage to unselected word lines; increasing a voltage levels of the selected word line voltage and the unselected word line voltage without discharging the selected word line and the unselected word lines after the verify operation is performed; and performing a program operation on the selected memory cells when the selected word line voltage and the unselected word line voltage reach a target voltage levels, respectively.

A program inhibit voltage may be applied to bit lines coupled to the selected memory cells when the selected word line voltage and the unselected word line voltage continuously increase.

A semiconductor memory device according to an embodiment of the present invention includes a memory cell array including a plurality of memory cells coupled to a plurality of word lines; a voltage generator configured to generate a selected word line voltage during a verify operation; and an address decoder configured to apply the selected word line voltage to a selected word line, among the plurality of word lines. The voltage generator is configured to continuously increase the selected word line voltage after the verify operation is performed. A program operation is performed on selected memory cells coupled to the selected word line when the selected word line voltage reaches a program voltage level.

DETAILED DESCRIPTION

Hereinafter, the embodiments of the present invention will be described in detail with reference to the accompanying drawings. This invention may, however, be embodied in different forms and should not be construed as limited to the embodiments set forth herein. Rather, these embodiments are provided so that this disclosure is thorough and complete and fully conveys the scope of the present invention to one skilled in the art.

In this specification, 'connected/coupled' represents that one component is directly coupled to another component or indirectly coupled through another component.

In this specification, it will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Figure 1:
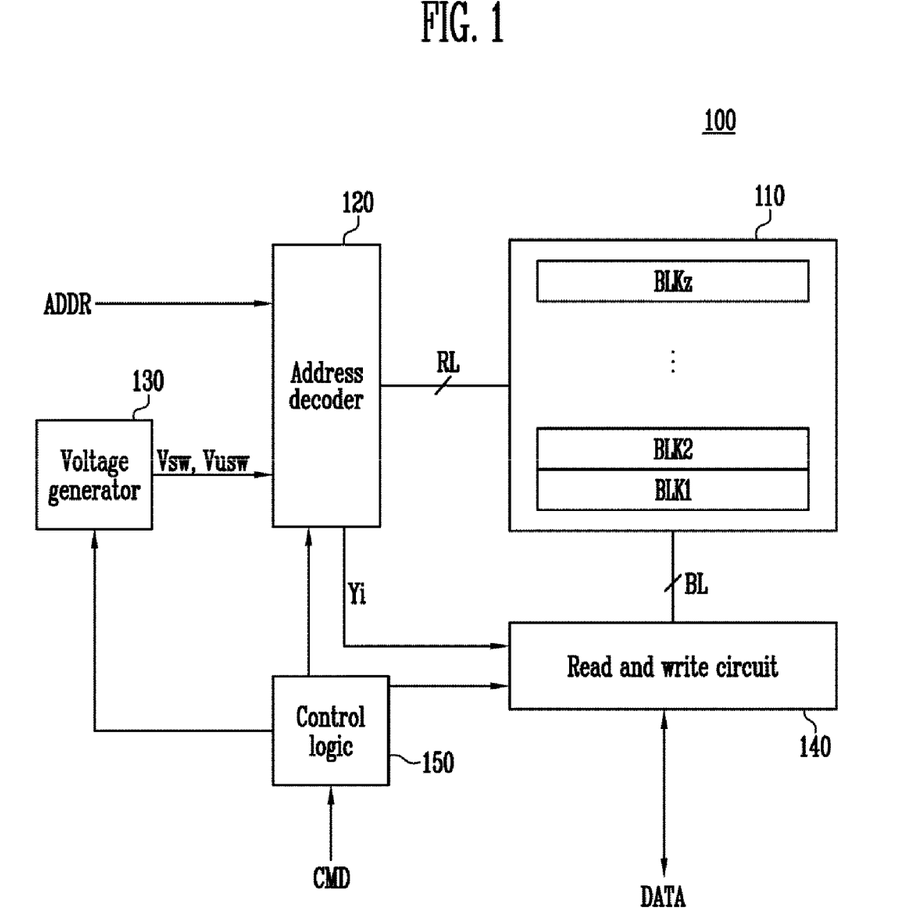
FIG. 1 is a block diagram illustrating a semiconductor memory device.

FIG. 1 is a block diagram illustrating a semiconductor memory device 100.

Referring to FIG. 1, the semiconductor memory device 100 includes a memory cell array 110, an address decoder 120, a voltage generator 130, a read and write circuit 140, and a control logic 150.

The memory cell array 110 includes a plurality of memory blocks BLK1 to BLKz, z being a positive integer. The memory blocks BLK1 to BLKz are coupled to the address decoder 120 through row lines RL, e.g., word lines. The memory blocks BLK1 to BLKz are coupled to the read and write circuit 140 through column lines, e.g., bit lines BL. Each of the memory blocks BLK1 to BLKz may include a plurality of memory cells. According to an embodiment, the memory cells may include non-volatile memory cells.

The address decoder 120, the voltage generator 130, the read and write circuit 140, and the control logic 150 operate as peripheral circuits configured to drive the memory cell array 110.

The address decoder 120 is coupled to the memory cell array 110 through the row lines RL. The address decoder 120 operates under the control of the control logic 150. The address decoder 120 receives addresses ADDR through an input/output buffer (not illustrated) in the semiconductor memory device 100.

The address decoder 120 is configured to decode a block address among the addresses ADDR. The address decoder 120 selects at least one of the memory blocks BLK1 to BLKz in response to the decoded block address.

The address decoder 120 is configured to decode a row address among the addresses ADDR. The address decoder 120 is configured to apply voltages, supplied from the voltage generator 130, to the row lines RL in response to the decoded row address.

The address decoder 120 is configured to decode a column address among the addresses ADDR. The address decoder 120 transmits a decoded column address Yi to the read and write circuit 140.

Program of the semiconductor memory device 100 may be performed by page units. If there is a program request, the addresses ADDR including the block address, the row address, and the column address are input to the address decoder 120. The address decoder 120 selects a single memory block and a single word line in response to the block address and the row address, respectively. The column address is decoded by the address decoder 120 and supplied to the read and write circuit 140.

The address decoder 120 may include an address buffer, a block decoder, a row decoder, and a column decoder.

The voltage generator 130 generates a plurality of voltages using an external power voltage that is supplied to the semiconductor memory device 100 from an external power source. The voltage generator 130 operates under the control of the control logic 150. The voltage generator 130 may generate an internal power voltage by regulating the external power voltage. The internal power voltage, generated by the voltage generator 130, may be used as a driving voltage of the address decoder 120, the read and write circuit 140, and the control logic 150.

In addition, the voltage generator 130 may generate word line voltages Vsw and Vusw having high voltage levels using the external power voltage or the internal power voltage. For example, the voltage generator 130 may include a plurality of pumping capacitors that receive the internal power voltage and may generate the word line voltages Vsw and Vusw by selectively activating the pumping capacitors under the control of the control logic 150. The word line voltages Vsw and Vusw are applied to word lines by the address decoder 120. The selected word line voltage Vsw is applied to a selected word line by the address decoder 120. The unselected word line voltage Vusw is applied to an unselected word line by the address decoder 120.

The read and write circuit 140 is coupled to the memory cell array 110 through the bit lines BL. The read and write circuit 140 operates under the control of the control logic 150.

The read and write circuit 140 receives or outputs data DATA from or to an input/output buffer (not illustrated) of the semiconductor memory device 100. During a program operation, the read and write circuit 140 receives and stores the data DATA to be programmed and transfers the data DATA to selected bit lines, indicated by the decoded column address Yi, among the bit lines BL. According to the data DATA, threshold voltages of memory cells coupled to the selected word line (hereinafter, referred to as "selected memory cells") may increase. During a verify operation, the read and write circuit 140 reads out the threshold voltages of the selected memory cells through the selected bit lines, indicated by the decoded column address Yi, among the bit lines BL, and determines whether or not the threshold voltages of the selected memory cells reach desired levels. According to a result of the determination, the program operation may be repeated.

According to an embodiment, the read and write circuit 140 includes page buffers (or page registers) and a column selection circuit.

The control logic 150 is coupled to the address decoder 120, the voltage generator 130, and the read and write circuit 140. The control logic 150 receives a command CMD, which indicates a program, read, or erase operation, through the input/output buffer (not illustrated) of the semiconductor memory device 100. The control logic 150 controls the operations of the semiconductor memory device 100 in response to the command CMD.

According to an embodiment of the present invention, after the verify operation is performed by applying the selected word line voltage Vsw and the unselected word line voltage Vusw to the selected and unselected word lines, respectively, the control logic 150 controls the voltage generator 130 to generate the selected word line voltage Vsw and the unselected word line voltage Vusw that continuously increase during a time interval between the verify operation and the program operation. In other words, after the verify operation is completed, the voltages applied to the selected and unselected word lines continuously increase without discharging the selected word line and unselected word lines. After a predetermined period of time, the selected word line voltage Vsw and the unselected word line voltage Vusw may reach desired voltage levels required for a program operation. When the selected word line voltage Vsw and the unselected word line voltage Vusw reach the desired voltage levels, the program operation is performed.

As the selected word line voltage Vsw and the unselected word line voltage Vusw continuously increase, memory cells coupled to word lines may be inadvertently programmed. According to an embodiment of the present invention, while the selected word line voltage Vsw and the unselected word line voltage Vusw continuously increase, the control logic 150 controls the read and write circuit 140 to supply a program inhibit voltage to the bit lines BL to prevent the memory cells from being inadvertently programmed while the selected word line voltage Vsw and the unselected word line voltage Vusw are increasing.

According to an embodiment of the present invention, discharging of word lines after the verify operation and before the program operation is omitted, and the voltages applied to the word lines continuously increase until they reach the desired voltage levels. Therefore, a program speed of the semiconductor memory device 100 may reduce since it is possible to save a time as much as required for the discharging of the word lines.

Figure 2:
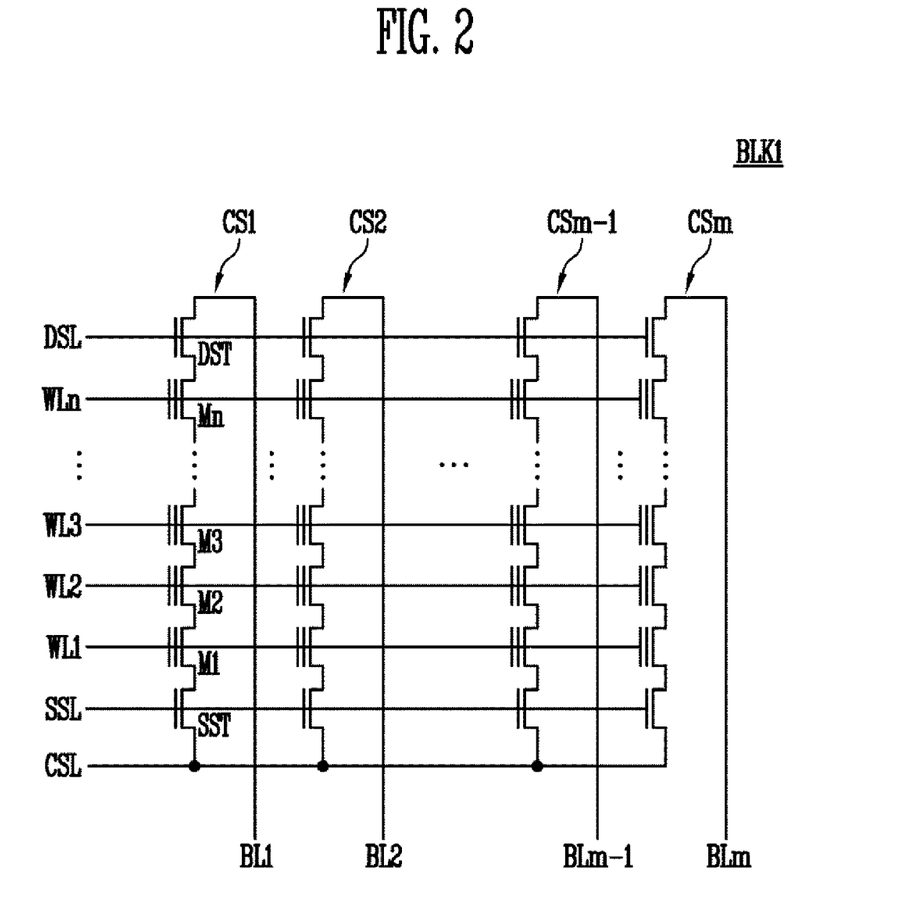
FIG. 2 is a block diagram illustrating one of a plurality of memory blocks of FIG. 1.

FIG. 2 is a block diagram illustrating one of the memory blocks BLK1 to BLKz of FIG. 1, e.g., BLK1.

Referring to FIG. 2, the memory block BLK1 includes a plurality of cell strings CS1 to CSm, m being a positive integer. The cell strings CS1 to CSm are coupled to first to m-th bit lines BL1 to BLm, respectively.

Each of the cell strings CS1 to CSm includes a source selection transistor SST, a plurality of memory cells M1 to Mn coupled in series with each other, and a drain selection transistor DST, n being a positive integer. The source selection transistor SST is coupled to a source selection line SSL. The first to n-th memory cells M1 to Mn are coupled to first to n-th word lines WL1 to WLn, respectively. The drain selection transistor DST is coupled to a drain selection line DSL. A common source line CSL is coupled to a source of the source selection transistor SST. Each of the bit lines BL1 to BLm is coupled to a drain of the drain selection transistor DST of each of the cell strings CS1 to CSm. The cell strings CS1 to CSm share the drain selection line DSL, the source selection line SSL, the first to n-th word lines WL1 to WLn, and the common source line CSL. The row lines RL shown in FIG. 1 may include the source selection line SSL, the first to n-th word lines WL1 to WLn, the drain selection line DSL, and the common source line CSL shown in FIG. 2. Accordingly, the source selection line SSL, the first to n-th word lines WL1 to WLn, the drain selection line DSL, and the common source line CSL are driven by the address decoder 120.

Figure 3:
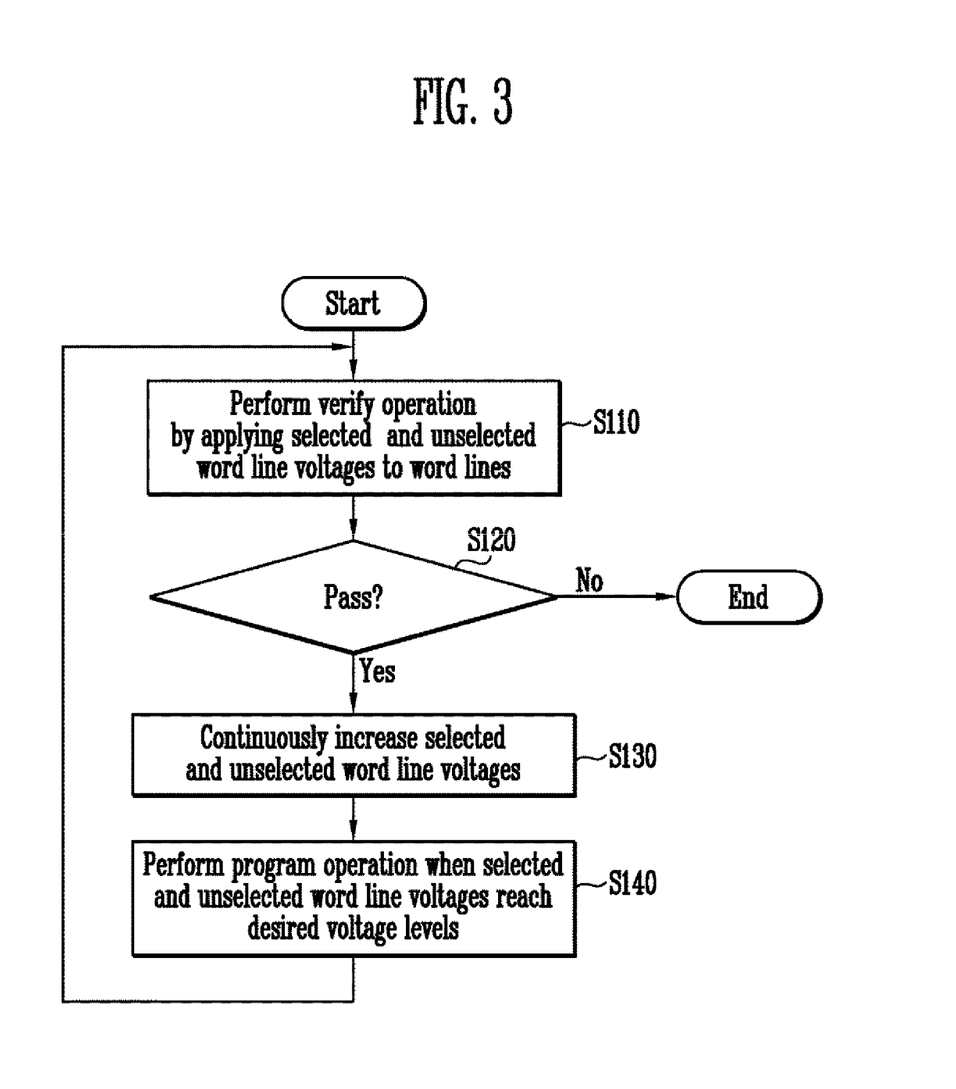
FIG. 3 is a flowchart illustrating a program method of a semiconductor memory device according to an embodiment of the present invention.

FIG. 3 is a flowchart illustrating a program method of the semiconductor memory device 100 according to an embodiment of the present invention.

Referring to FIGS. 1 to 3, a verify operation is performed by applying the selected word line voltage Vsw to a selected word line, e.g., a word line WL2, and the unselected word line voltage Vusw to unselected word lines, e.g., word lines WL1 and WL3 to WLn, at step S110. A voltage level of the selected word line voltage Vsw may be lower than a voltage level of the unselected word line voltage Vusw. For example, the selected word line voltage Vsw has a voltage level of approximately 0.5V, and the unselected word line voltage Vusw has a voltage level of approximately 5V. At this time, a power voltage is applied to the drain selection line DSL and the source selection line SSL. A ground voltage is applied to the common source line CSL.

When the corresponding voltages are applied to the row lines RL, i.e., the source selection line SSL, the first to n-th word lines WL1 to WLn, the drain selection line DSL, and the common source line CSL, in the above-described manner, the bit lines BL1 to BLm are precharged with a precharge voltage, e.g., the power voltage. Since the unselected word line voltage Vusw having approximately 5V is applied to the unselected word lines WL1 and WL3 to WLn, the unselected memory cells M1 and M3 to Mn coupled to the unselected word lines WL1 and WL3 to WLn, respectively, are turned on regardless of threshold voltages thereof. On the other hand, the selected memory cell M2 coupled to the selected word line WL2 is turned on or off according to the threshold voltage thereof since the selected word line voltage Vsw having approximately 0.5V is applied to the selected word line WL2. If the selected memory cell M2 is turned on or off while the unselected memory cells M1 and M3 to Mn are turned on, voltages of the bit lines BL1 to BLm may vary depending on whether or not the selected memory cell M2 of each of the cell strings CS 1 to CSm is turned on. Thus, the threshold voltages of the selected memory cells of the cell strings CS 1 to CSm are read out through the bit lines BL1 to BLm, and it is determined whether or not the selected memory cells have desired threshold voltages at step S120. If the selected memory cells have the desired threshold voltages, the program to the selected memory cells is passed and the program may be terminated. If the selected memory cells do not have the desired threshold voltages, S130 may be performed.

The selected word line voltage Vsw and the unselected word line voltage Vusw continuously increase without discharging the word lines WL at step S130. The control logic 150 controls the voltage generator 130 to continuously increase the selected word line voltage Vsw and the unselected word line voltage Vusw.

According to an embodiment, while the selected word line voltage Vsw and the unselected word line voltage Vusw continuously increase, a program inhibit voltage is applied to the bit lines BL. Since the program inhibit voltage is applied to the bit lines BL, the threshold voltages of the memory cells are prevented from inadvertently increasing by the selected word line voltage Vsw and the unselected word line voltage Vusw that continuously increase.

A subsequent program operation is performed when the selected word line voltage Vsw and the unselected word line voltage Vusw reach desired voltage levels at step S140. According to an embodiment, the control logic 150 checks whether or not a predetermined time has passed since the verify operation is completed, and controls the semiconductor memory device 100 in order to perform the program operation. According to another embodiment, a circuit for detecting voltage levels of the word lines WL is additionally provided, and the control logic 150 controls the semiconductor memory device 100 to perform the program operation according to the detection result.

According to an embodiment of the present invention, after the verify operation is completed, the word lines WL are not discharged, and the voltages of the word lines WL continuously increase. Therefore, a program speed of the semiconductor memory device 100 may reduce.

Figure 4:
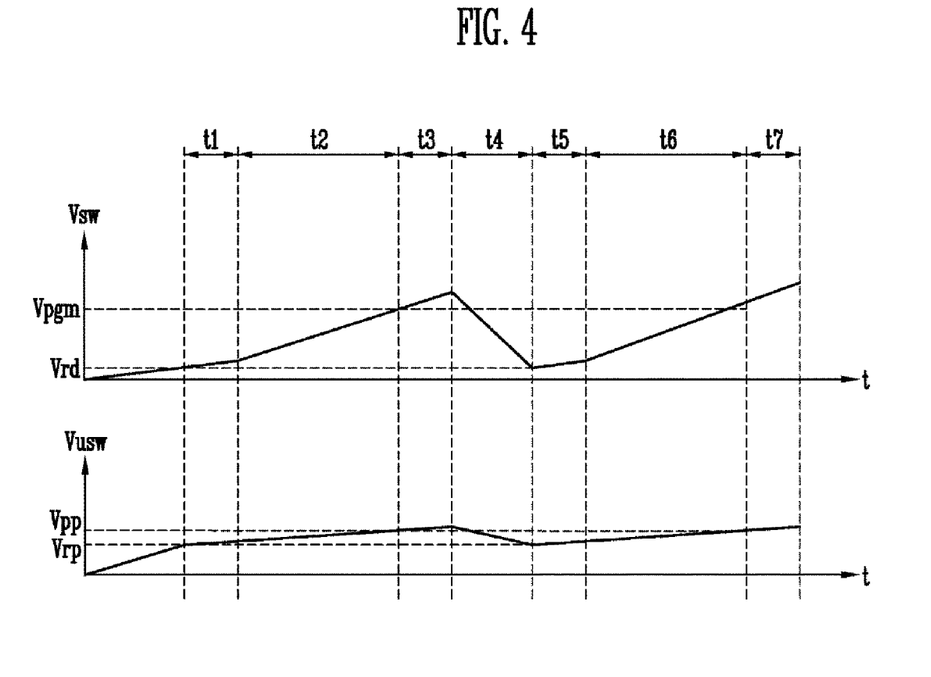
FIG. 4 is a graph illustrating voltages applied to a selected word line and an unselected word line.

FIG. 4 is a graph illustrating level changes of a selected word line voltage Vsw and an unselected word line voltage Vusw applied to word lines WL while program loops each including a verify operation and a program operation is performed.

Referring to FIGS. 1, 2, and 4, during a first time period t1, the verify operation is performed when the selected word line voltage Vsw reaches a read voltage level Vrd, and the unselected word line voltage Vusw reaches a read pass voltage level Vrp. The read voltage level Vrd may be lower than the read pass voltage level Vrp.

The present invention is not limited to an example in which a single verify operation is performed per program loop. According to an embodiment, if each of memory cells of the memory cell array 110 is defined as a single level cell, a single verify operation may be performed during the first time period t1. On the other hand, according to another embodiment, if each of the memory cells is a multi level cell that stores two or more bits, two or more verify operations may be performed during the first time period t1.

According to a result of the verify operation during the first time period t1, the selected word line voltage Vsw and the unselected word line voltage Vusw may be controlled as illustrated in a second time period t2 of FIG. 4.

During the second time period t2, the word lines WL are not discharged, and the selected word line voltage Vsw and the unselected word line voltage Vusw continuously increase until they reach target voltage levels.

A rising slope of each of the selected word line voltage Vsw and the unselected word line voltage Vusw may be controlled. For example, the voltage generator 130 may include a component such as a ramper. The ramper may be configured to adjust the rising slopes of the selected word line voltage Vsw and the unselected word line voltage Vusw under the control of the control logic 150.

During a third time period t3, when the selected word line voltage Vsw and the unselected word line voltage Vusw reach a program voltage level Vpgm and a program pass voltage level Vpp, respectively, the program operation is performed. The program voltage level Vpgm may be higher than the program pass voltage level Vpp. When the corresponding voltages having the program voltage level Vpgm and the program pass voltage level Vpp, respectively, are applied to the word lines, a reference voltage, e.g., ground voltage, is applied to a bit line coupled to a memory cell to be programmed, and a program inhibit voltage, e.g., a power voltage, is applied to bit lines coupled to memory cells to be program-inhibited. As a result, a threshold voltage of the memory cell to be programmed increases.

During a fourth time period t4, the selected word line voltage Vsw and the unselected word line voltage Vusw decrease to prepare for a next verify operation. According to an embodiment of the present invention, in order to perform the next verify operation, the selected word line voltage Vsw decreases to the read voltage level Vrd, and the unselected word line voltage Vusw decreases to the read pass voltage level Vrp. According to embodiments, there are various methods to decrease the voltage levels of the selected word line voltage Vsw and the unselected word line voltage Vusw. The methods include a method of blocking a bias source in the voltage generator 130 which is used to increase the voltage levels of the selected word line voltage Vsw and the unselected word line voltage Vusw before discharging the word lines WL, a method of discharging the word lines WL while maintaining the bias source in the voltage generator 130, and a method of using an another bias source in the voltage generator 130 while maintaining the bias source in the voltage generator 130.

Fifth to seventh time periods t5 to t7 are similar to the first to third time periods t1 to t3.

During the fifth time period t5, the next verify operation is performed when the selected word line voltage Vsw and unselected word line voltage Vusw reach the read voltage level Vrd and the read pass voltage level Vrp, respectively. The next verify operation is performed in substantially the same manner as the previous verify operation. During the sixth time period t6, the selected word line voltage Vsw and the unselected word line voltage Vusw continuously increase without being discharged. The selected word line voltage Vsw may have a steeper rising slope during the sixth time period t6 than during the second time period t2. During the seventh time period t7, a next program operation is performed. When the selected word line voltage Vsw reaches a voltage level higher than the program voltage level Vpgm, the next program operation is performed. As described above, the voltage level of the selected word line voltage Vsw used in each program operation increases by stages.

Figure 5:
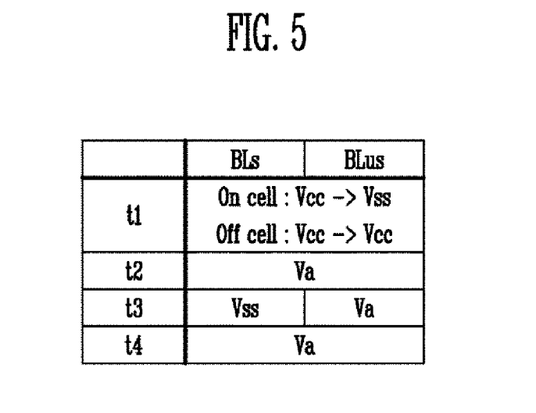
FIG. 5 is a table showing voltages of bit lines during first to fourth time periods of FIG. 4.

FIG. 5 is a table showing voltages of the bit lines BL during the first to fourth time periods t1 to t4 of FIG. 4.

Referring to FIG. 5, before the first time period t1, the bit lines BL have a precharge voltage, e.g., a power voltage Vcc, and then, during the first time period t1, a voltage of each bit line is changed to a reference voltage Vss or the power voltage Vcc according to a result of a verify operation. For example, a voltage of a bit line coupled to a cell, which is turned on, is changed to the reference voltage Vss, and a voltage of a bit line coupled to a cell, which is turned off, maintains the power voltage Vcc.

During the second time period t2, when the selected word line voltage Vsw and the unselected word line voltage Vusw continuously increase, a program inhibit voltage Va is applied to the bit lines BL. The program inhibit voltage Va may be the power voltage Vcc. Therefore, as the program inhibit voltage Va is applied to the bit lines BL, the threshold voltages of the memory cells may be prevented from inadvertently increasing.

During the third time period t3, when a program operation is performed, the reference voltage Vss is applied to a bit line BLs coupled to a memory cell to be programmed, and the program inhibit voltage Va is applied to a bit line BLus coupled to a memory cell to be program-inhibited. As a result, a threshold voltage of the memory cell to be programmed increases, and a threshold voltage of the memory cell to be program-inhibited is maintained.

During the fourth time period t4, the program inhibit voltage Va is applied to the bit lines BL. As a result, the memory cells may be prevented from being inadvertently programmed by the selected word line voltage Vsw and the unselected word line voltage Vusw.

Figure 6:
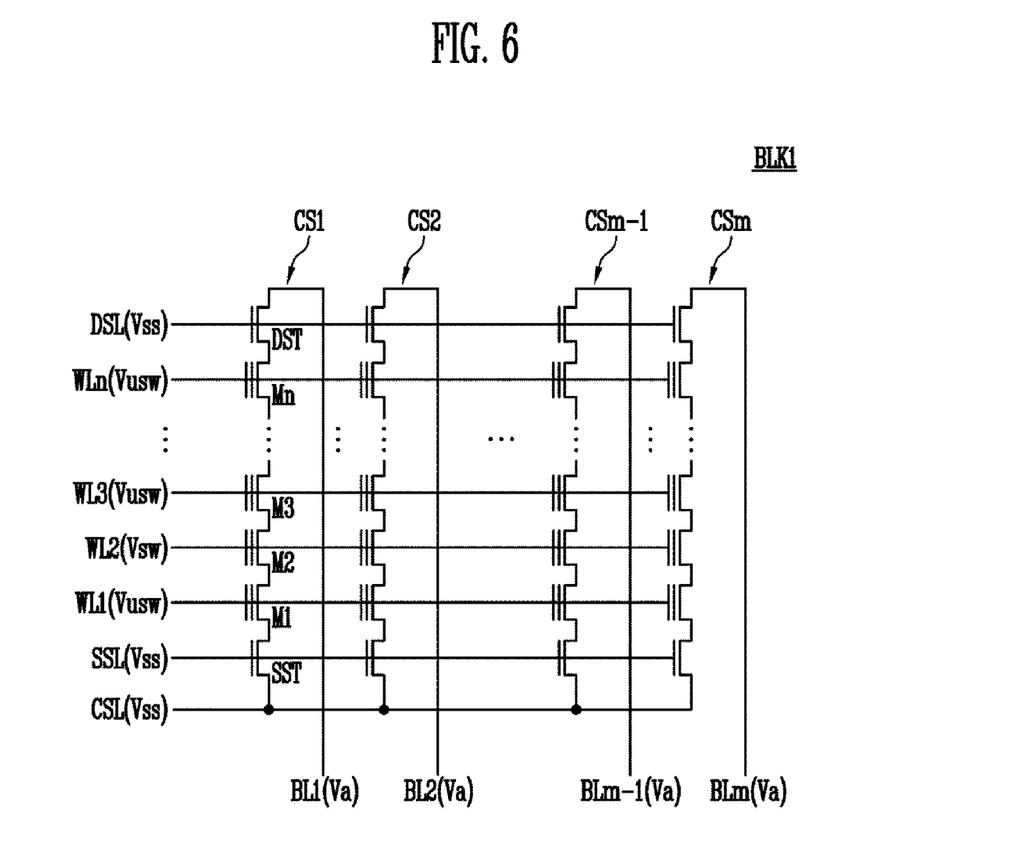
FIG. 6 is a view illustrating voltages applied to a memory block during the second and fourth time periods of FIG. 5.

FIG. 6 is a view illustrating voltages applied to a memory block, e.g., the first memory block BLK1, during the second and fourth time periods t2 and t4. Hereinafter, it is assumed that the first memory block BLK1 is selected from among the first to z-th memory blocks BLK1 to BLKz of FIG. 1, and that the second word line WL2 is selected.

Referring to FIG. 6, the reference voltage Vss is applied to the drain selection line DSL, the source selection line SSL, and the common source line CSL. The selected word line voltage Vsw is applied to the selected word line WL2, and the unselected word line voltage Vusw is applied to the unselected word lines WL1 and WL3 to WLn. As described above with reference to FIG. 4, memory cells of the first memory block BLK1 may be inadvertently programmed by the selected word line voltage Vsw and the unselected word line voltage Vusw. However, according to an embodiment of the present invention, since the program inhibit voltage Va is applied to the bit lines BL1 to BLm, threshold voltages of the memory cells may be maintained without being inadvertently programmed.

Figure 7:
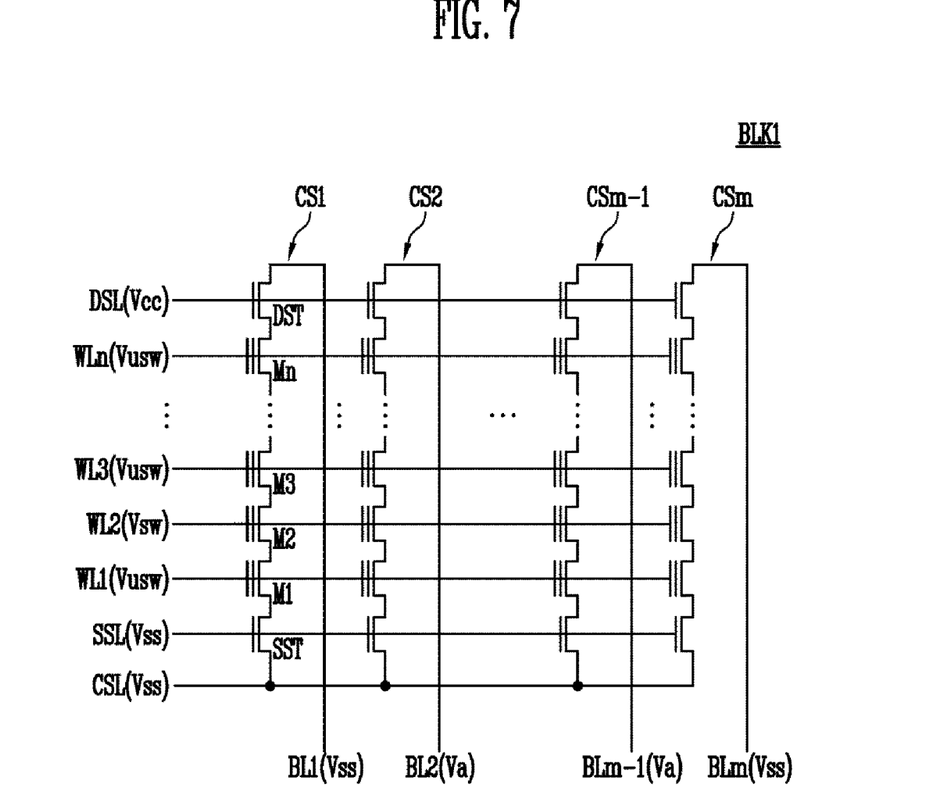
FIG. 7 is a view illustrating voltages applied to a memory block during the third time period of FIG. 5.

FIG. 7 is a view illustrating voltages applied to a memory block, e.g., the first memory block BLK1, during the third time period t3 of FIG. 5.

With reference to FIG. 7, during a program operation, the reference voltage Vss is applied to the source selection line SSL and the common source line CSL, and the power voltage Vcc is applied to the drain selection line DSL. The selected word line voltage Vsw is applied to the selected word line WL2, and the unselected word line voltage Vusw is applied to the unselected word lines WL1 and WL3 to WLn. The program inhibit voltage Va or the reference voltage Vss is applied to each of the bit lines BL1 to BLm according to data to be programmed. In FIG. 7, the reference voltage Vss is applied to the bit lines BL1 and BLm coupled to memory cells to be programmed, and the program inhibit voltage Va is applied to the bit lines BL2 to BLm−1 coupled to memory cells to be program-inhibited. As a result, threshold voltages of the memory cells to be programmed may increase.

According to the embodiments of the present invention, during a period between a verify operation and a subsequent program operation, voltages applied to word lines continuously increase without discharging the word lines. That is, an operation of discharging the word lines, which used to be performed between a verify operation and a program operation, can be omitted according to the embodiment of the present invention. Therefore, a program speed of the semiconductor memory device 100 may be improved.

The embodiments of the present invention provide a semiconductor memory device having an improved program speed and a program method thereof.

What is claimed is:

1. A program method of a semiconductor memory device, the program method comprising:
    performing a verify operation on selected memory cells by applying a selected word line voltage to a selected word line coupled to the selected memory cells;
    increasing a voltage level of the selected word line voltage without discharging the selected word line after the verify operation is performed; and
    performing a program operation on the selected memory cells when the selected word line voltage reaches a program voltage level.

2. The program method of claim 1, wherein a program inhibit voltage is applied to bit lines coupled to the selected memory cells while the selected word line voltage increases.

3. The program method of claim 2, wherein the program inhibit voltage is a power voltage.

4. The program method of claim 2, wherein the performing of the program operation comprises:
    applying a reference voltage to first bit lines coupled to memory cells to be programmed, among the selected memory cells; and
    applying the program inhibit voltage to second bit lines coupled to memory cells to be program-inhibited, among the selected memory cells.

5. The program method of claim 1, wherein the performing of the verify operation further comprises applying an unselected word line voltage to unselected word lines, and
    wherein the program method further comprises increasing a voltage level of the unselected word line voltage without discharging the unselected word lines after the verify operation is performed.

6. The program method of claim 5, wherein the program operation is performed when the unselected word line voltage reaches a program pass voltage level.

7. The program method of claim 6, wherein, in the verify operation, the voltage level of the selected word line voltage is lower than that of the unselected word line voltage, and
    wherein the program voltage level is higher than the program pass voltage level.

8. A program method of a semiconductor memory device, the program method comprising:
    performing a first verify operation on selected memory cells by applying a selected word line voltage to a selected word line and applying an unselected word line voltage having a higher voltage level than the selected word line voltage to unselected word lines;
    increasing a voltage levels of the selected word line voltage and the unselected word line voltage without discharging the selected word line and the unselected word lines after the first verify operation is performed; and
    performing a program operation on the selected memory cells when the selected word line voltage and the unselected word line voltage reach target voltage levels, respectively.

9. The program method of claim 8, wherein a program inhibit voltage is applied to bit lines coupled to the selected memory cells while the voltage levels of the selected word line voltage and the unselected word line voltage increase.

10. The program method of claim 9, wherein the program inhibit voltage is a power voltage.

11. The program method of claim 8, wherein the program operation is performed when the selected word line voltage reaches a program voltage level and the unselected word line voltage reaches a program pass voltage level lower than the program voltage level.

12. The program method of claim 8, further comprising:
    decreasing the voltage levels of the selected word line voltage and the unselected word line voltage to a read voltage level and a read pass voltage level, respectively, after the program operation is completed, the read pass voltage level being higher than the read voltage level;
    performing a second verify operation on the selected memory cells by applying the selected word line voltage having the read voltage level to the selected word line and applying the unselected word line voltage having the read pass voltage level to the unselected word lines.

13. The program method of claim 12, wherein a program inhibit voltage is applied to bit lines coupled to the selected memory cells while the selected and unselected word line voltages decrease.

14. A semiconductor memory device, comprising:
    a memory cell array including a plurality of memory cells coupled to a plurality of word lines;
    a voltage generator configured to generate a selected word line voltage during a verify operation; and
    an address decoder configured to apply the selected word line voltage to a selected word line among the plurality of word lines,
    wherein the voltage generator is configured to continuously increase the selected word line voltage after the verify operation is performed, and
    wherein a program operation is performed on selected memory cells coupled to the selected word line when the selected word line voltage reaches a program voltage level.

15. The semiconductor memory device of claim 14, further comprising a read and write circuit coupled to the plurality of memory cells through a plurality of bit lines,
    wherein the read and write circuit is configured to apply a program inhibit voltage to the plurality of bit lines while the selected word line voltage increases.

16. The semiconductor memory device of claim 15, wherein the program inhibit voltage is a power voltage.

17. The semiconductor memory device of claim 14, wherein the voltage generator is configured to generate an unselected word line voltage during the verify operation, wherein the address decoder is configured to apply the unselected word line voltage to unselected word lines among the plurality of word lines, and wherein the voltage generator is configured to continuously increase the unselected word line voltage after the verify operation is performed.

18. The semiconductor memory device of claim 17, wherein the program operation is performed when the unselected word line voltage reaches a program pass voltage level.

19. The semiconductor memory device of claim 18, wherein the program voltage level is higher than the program pass voltage level.

20. The semiconductor memory device of claim 17, further comprising a read and write circuit coupled to the plurality of memory cells through a plurality of bit lines, wherein the read and write circuit is configured to apply a program inhibit voltage to the plurality of bit lines while the selected word line voltage and the unselected word line voltage increase.

* * * * *